United States Patent [19]
Enomoto

[11] Patent Number: 4,792,646
[45] Date of Patent: Dec. 20, 1988

[54] CERAMIC WIRING BOARD AND ITS PRODUCTION

[75] Inventor: Eyo Enomoto, Oogaki, Japan

[73] Assignee: Ibiden Kabushiki Kaisha, Oogaki, Japan

[21] Appl. No.: 97,452

[22] Filed: Sep. 16, 1987

Related U.S. Application Data

[62] Division of Ser. No. 839,730, Mar. 14, 1986, Pat. No. 4,715,117.

[30] Foreign Application Priority Data

Apr. 3, 1985 [JP] Japan .................................. 60-69196

[51] Int. Cl.$^4$ ............................................. H05K 1/00
[52] U.S. Cl. ..................... 174/68.5; 29/851; 29/852
[58] Field of Search ................. 174/685; 29/846, 851, 29/852; 427/97

[56] References Cited

U.S. PATENT DOCUMENTS

| | | | |
|---|---|---|---|
| 4,313,026 | 1/1982 | Yamada et al. | 174/68.5 |
| 4,641,425 | 2/1987 | Dubuisson et al. | 29/851 X |
| 4,672,152 | 6/1987 | Shinohara et al. | 174/68.5 |
| 4,681,656 | 7/1987 | Byrum | 29/851 X |
| 4,705,592 | 11/1987 | Bahrle et al. | 29/852 |
| 4,715,117 | 12/1987 | Enomoto | 29/851 |

FOREIGN PATENT DOCUMENTS

| | | |
|---|---|---|
| 90959 | 7/1975 | Japan . |
| 23796 | 3/1981 | Japan . |
| 100495 | 8/1981 | Japan . |

OTHER PUBLICATIONS

Humenik, J. N. et al; Multilayer Ceramic Substrates Containing Mullite; IBM Technical Disclosure Bulletin; vol. 20, No. 11B; Apr. 1978; p. 4787.
McDermott, C. J.; Face Protection of Printed Circuit Boards; IBM Technical Disclosure Bulletin; vol. 11, No. 7; Dec. 1968; p. 733.

Primary Examiner—Morris H. Nimmo
Attorney, Agent, or Firm—Balogh, Osann, Kramer, Dvorak, Genova & Traub

[57] ABSTRACT

A ceramic substrate having a plurality of holes arranged regularly with a specified pitch can be used for an universal high density ceramic wiring board, wherein predetermined one or more holes among said plurality of holes are used as through holes for interconnecting both side circuits, and the remaining holes not used for a circuit are filled with an electrical insulating material.

Said ceramic substrate of universal type can easily be produced inexpensively and within a short lead time, because said substrate requires no individual mold for each of various circuits to punch a green sheet and can be kept in stock as a fired ceramic substrate.

4 Claims, 4 Drawing Sheets

CERAMIC WIRING BOARD AND ITS PRODUCTION

This is a divisional of co-pending application Ser. 839,730 filed on Mar. 14, 1986 (now U.S. Pat. No. 4,715,117).

BACKGROUND OF THE INVENTION

This invention relates to a ceramic wiring board and its production process and, more particularly, to a high-density ceramic wiring board having through holes suitable for a hybrid IC or an IC package and its production process.

With the progress in electronic techniques in recent years, enhancement of the density of an electronic device or speed-up of operational function is being advanced. As a result, it becomes necessary that a wiring board has a high density circuit and high reliability and, particularly, a wiring board having characteristics such as low thermal expansion, high thermal conductivity, excellent dimensional stability and excellent electrical properties is required.

Examples of known substrates having characteristics as described above include those comprising ceramics, for example, alumina, beryllia, silicon carbide, and aluminum nitride. Among those ceramic substrates, an alumina substrate is the most widely used as a wiring board for hybrid IC from the viewpoint of characteristics such as mechanical strength, electrical properties, thermal conductivity, thermal expansion, and production cost.

In order to realize a high density or double-sided mounting of the wiring board, it is sometimes necessary that said board be provided with through holes for interconnecting both sides circuits or with through holes for soldering leads of electric components.

However, a substrate comprising a ceramic material such as the above has high hardness and poor processability, so that processing for making holes in a fired ceramic substrate is extremely difficult. Therefore, for a substrate which is used as a ceramic wiring board provided with through holes, a method is usually adopted in which holes are made by punching on the desired positions of a green sheet with a mold and the green sheet is fired. However, this method has problems that it is necessary to fabricate an individual mold for each substrate having a different wiring circuit, so that the lead time is lengthened, the cost is increased, and stock control of fired substrates and molds becomes troublesome. Further it has technical problems that when a substrate has a design in which the arrangement of a plurality of holes is biased, the dimensional accuracy is low because firing shrinkage differs locally.

Therefore, in the development and trial production of a ceramic wiring board having through holes for which the lead time is required to be short, the formation of through holes are carried out by means of, for example, $CO_2$ gas laser, which is low productivity and very expensive.

SUMMARY OF THE INVENTION

It is an object of this invention to provide a ceramic wiring board having through holes and its production process which are freed from problems of the above conventional ceramic wiring board and its production process. Namely, this invention relates to a ceramic wiring board comprising a ceramic substrate having a plurality of holes arranged regularly with a specified pitch, one or more holes selected from said plurality of holes being filled with an electrical insulating material, and a conductor circuit being formed on the surface of said substrate and in at least one hole of through holes of said substrate, and to a production process of the same.

DETAILED DESCRIPTION OF THE INVENTION AND PREFERRED EMBODIMENTS

Figure 1A:
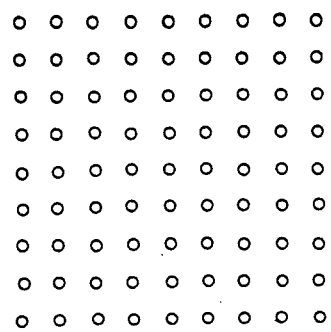
FIGS. 1(A) to (F) are each a plan view of an example of the arrangement of holes formed in a ceramic substrate of this invention.
Figure 1B:
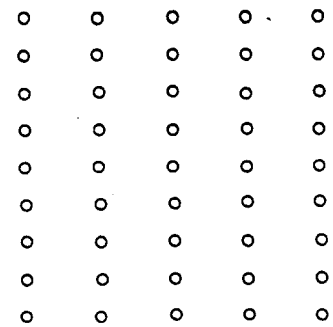

It is necessary that the ceramic wiring board of this invention is composed of a ceramic substrate having a plurality of holes arranged regularly with a specified pitch, one or more holes selected from said plurality of holes being filled with an electrical insulating material. Namely, this ceramic wiring board is made of a ceramic substrate having a plurality of holes arranged regularly with a specified pitch, wherein some holes among said plurality of holes which are not used for a predetermined circuit are filled with an electrical insulating material and the remaining unfilled holes are used as through holes for interconnecting both sides circuits of said substrate.

On the other hand, because a conventional ceramic substrate having through holes is made by punching holes on only the desired positions of a green sheet and firing the green sheet, it has been necessary that an individual mold must be fabricated for each substrate of a different wiring circuit and through holes are made by punching on the green sheet with this mold, and that sometimes the size and hole arrangement of a mold must be suitably changed according to the firing shrinkage of a green sheet.

Recently it has become frequent practice that a wiring circuit of such a wiring board is designed with the aid of a computer, and therefore there is an increasing tendency that the position of through holes and the wiring pattern are designed with a given regularity. Therefore, the use of the present invention ceramic substrate having a plurality of holes regularly arranged with a specified pitch in response to the circuit design with such a regularity, wherein some holes among said plurality of holes which are not used as through holes for a wiring circuit are filled with an electrical insulating material, can realize the following various advantages. The necessity of fabricating an individual mold for each substrate of a different wiring circuit can be eliminated and instead a universal mold can be used. Because the present invention ceramic substrate has a plurality of holes arranged regularly with a specified pitch and it can be stocked as a fired ceramic, a ceramic wiring board having through holes can be produced at low cost and within a very short lead time and the stock control of molds and fired substrates can be greatly improved. Moreover, the ceramic substrate of the present invention has a plurality of holes arranged regularly with a specified pitch, so that the firing shrinkage can be brought into uniformity and a high dimensional accuracy can be obtained.

A process for producing a ceramic multilayer printed circuit board is disclosed in Japanese Patent Laid-Open No. 100495/1981.

The invention disclosed in said publication relates to a production process of a ceramic multilayer printed circuit board by a green sheet process as described in the columns of "Detailed Description of the Invention" for clearly defining the description of its claims, and consists in a process in which the positions of holes made in a green sheet include all of the positions at which through holes are desired to form on at least one layer of a multilayer substrate, and those through holes of a green sheet which require no connection between upper and lower surfaces are filled with an insulating paste in the state of green sheet. On the contrary, the invention of this application, as described above, relates to a substrate prepared by using a fired ceramic substrate having a plurality of holes arranged regularly with a specified pitch and filling one or more holes of said holes of the fired ceramic substrate with an electrical insulating material and to a process for producing the same, so that the present invention is clearly different in this respect from the one described in the above publication.

It is desirable that the ceramic substrate of this invention has a volmme resistivity of $10^8$ $\Omega$-cm or higher. This is because, when said resistivity is lower than $10^8$ $\Omega$-cm insulation treatment for securing the electric insulation of through holes is necessary, which makes the process complicated and makes preparation of a high-density substrate difficult.

It is desirable that the material for a ceramic substrate of this invention is at least one selected from the group consisting of alumina, beryllia, mullite, low-temperature fireable ceramic (a ceramic comprising a base such as alumina and a low-melting component, crystallized glass or crystalline ceramic), a dielectric ceramic such as barium titanate, aluminum nitride, and silicon carbide, among which alumina, low-temperature fireable ceramic and aluminum nitride can be used advantageously, because they have good balance among properties and are excellent in processability and mass productivity for the reason that they can be made through the green sheet process.

Figure 1C:
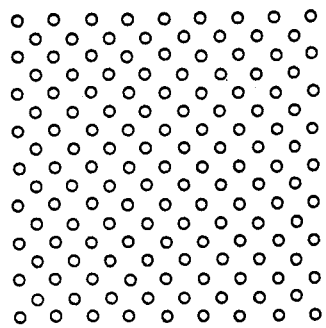
Figure 1D:
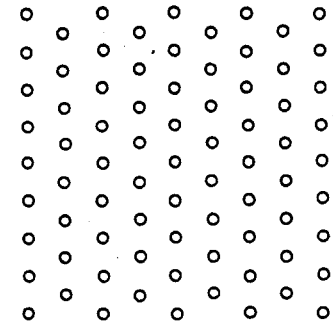
Figure 1E:
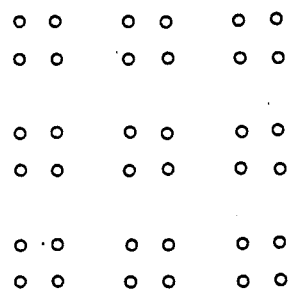
Figure 1F:
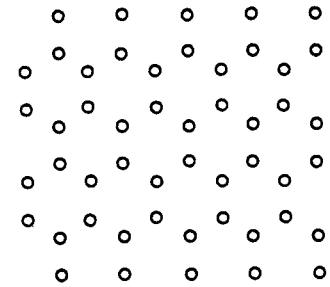

It is necessary that a plurality of the holes of the ceramic substrate of this invention are arranged regularly with a specified pitch and, more particularly, it is desirable that they are arranged on lines which are parallel with at least one direction and spaced from each other with a specified pitch. For example, the holes may be arranged in the manner as shown in FIGS. 1(A) to (F) or their combinations, and the size of a hole may be suitably changed. Especially, when most of a plurality of the holes are arranged on grid as shown in FIG. 1(A) or FIG. 1(C), the circuit design of the substrate is easy and the product is excellent in versatility. It is desirable that the pitch of said grid is, for example, 2.54 mm (100 mil) or 1.27 mm (50 mil) which is the pitch of a lead of an electronic components.

Any materials that are excellent in electrical insulation, thermal properties, fillability into through holes, etc. can be suitably used as said electrical insulating materials, and it is particularly desirable to use at least one selected from the group consisting of a heat-resistance resin, a mixture thereof with a filler, and glass, among which a heat-resistance resin and a mixture thereof with a filler are suitable because of their low curing temperatures and excellent processability. It is desirable that said electrical insulating material is used in the form of a paste.

Examples of said heat-resistance resins which can be used advantageously include epoxy resins, heat-resistance epoxy resins, epoxy-modified polyimide resins, polyimide resins, phenolic resins, and triazine resins. Examples of said filler powders which can be used advantageously include alumina, beryllia, silica, glass, silicon nitride, boron nitride, aluminum nitride, silicon carbide and heat-resistance resin, and it is advantageous that said glass is a commercially available dielectric paste.

Processes which can be adopted in forming said conductor circuit include those employed generally in the fabrication of the conventional printed wiring boards or wiring boards for hybrid IC, for example, plating, metal foil adhesion, resin-based conductor paste, vacuum deposition, thick-film conductor paste, and combinations thereof. Although a thick-film conductor usually used in a conventional ceramic wiring board has problems such as high sheet resistivity, large high-frequency transmission loss, difficulty in attaining a high circuit density because of low fine line capability and need of a countermeasure against migration, these problems can be overcome by employing a plating process, so that this plating process can be used particularly advantageously. Examples of known plating processes include tenting process, panel pattern process, full additive process, and semi-additive process and, in addition, a multiwire process is performed.

Now the production of a ceramic wiring board of this ivention will be described with reference to FIGS. 2 and 3.

FIGS. 2(A) to (H) are illustrative diagrams of a production process of a ceramic wiring baard which is produced by a step of making a ceramic substrate having a plurality of holes arranged regularly with a specified pitch, a step of filling one or more holes selected from said plurality of holes with an electrical insulating material, and a step of forming a conductor circuit on the surface of said substrate and in at least one of through holes of said substrate.

Figure 2A:
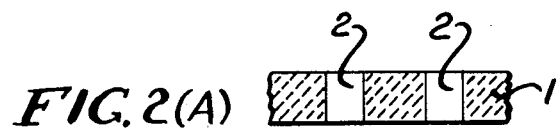
FIGS. 2(A) to (H) and FIGS. 3(A) to (G) are each a sectional view illustrating production steps of a ceramic wiring board of this invention, and FIGS. 4(A) and (B) are each a sectional view illustrating production steps of a multilayer ceramic wiring board of this invention.

FIG. 2(A) is a sectional view of a ceramic substrate 1 having a plurality of holes 2 and 2, arranged regularly with a specified pitch, which can be made through various processes including, for example, one which comprises forming holes in a green sheet by a mold and firing the sheet, one which comprises pressing a powder in a mold having a mechanism for forming holes and firing the powder-pressed body, one which comprises making holes in a powder-pressed body with drill and baking the body, and one which comprises making holes in a previously fired ceramic board by using $CO_2$-gas laser, ultrasonic processing, or a diamond drill. Among them, a process which comprises making holes in a green sheet by punching with a mold and firing the green sheet is excellent in mass productivity and so practical. It is also possible that this step is performed in conjunction with a step of processing its external shape or a step of forming grooves for chocolate break or a like step when holes are formed by a mold.

Figure 2B:
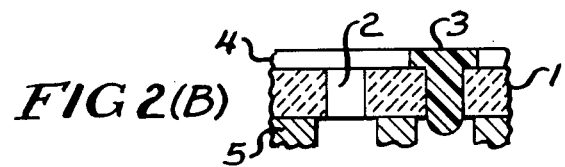

FIG. 2(B) is a sectional view of a ceramic substrate in which part of holes selected from said plurality of holes 2 are filled with an electrical insulating material 3. Examples of processes for filling the predetermined holes with an electrical insulating material include one which comprises filling, only the predetermined holes with an electrical insulating material by screen printing method with a mask 4, such as a screen, a metal mask, or a dry film photoresist, and one which comprises filling the predetermined holes with an electrical insulating material by using an automatic hole filling apparatus with pins or a direct patterning apparatus for thick films. In FIG. 2(B), 5 represents a table of a screen printer. In order to improve the adhesion of said electrical insulating material to a ceramic substrate, it is also possible to subject the inside surfaces of the holes to chemical or physical roughening or to a coupling treatment with, for example, a silane coupling agent.

Figure 2C:

FIG. 2(C) is a sectional view of the substrate in a state in which a heat-resistance resin or a mixture thereof with a filler with which the holes are filled is dried, or dried and cured by heating, or in a state in which glass is molten by heating and solidified.

Figure 2D:
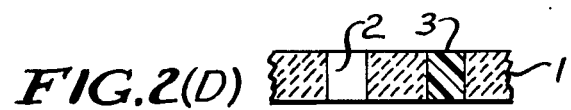
Figure 2E:
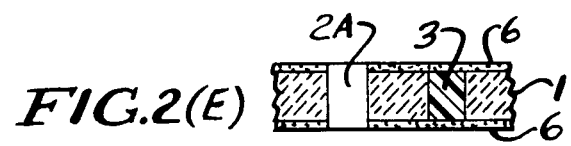
Figure 2F:
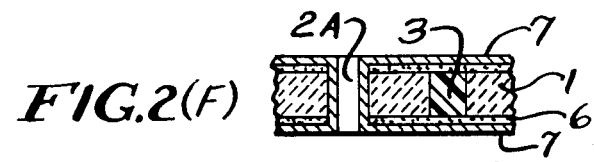
Figure 2G:
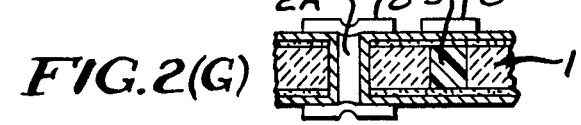
Figure 2H:
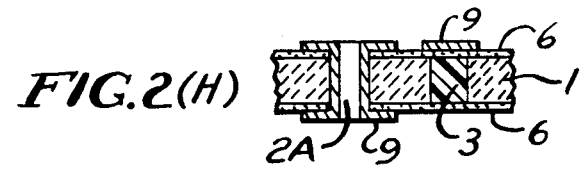

FIG. 2(D) is a sectional view of the substrate in a state in which the surface of the ceramic substrate is smoothed by grinding excess electrical insulating material 3 flowed over the holes of the ceramic substrate 1 shown in FIG. 2(C).

FIGS. 2(E) to (H) are sectional views illustrating, among the above-mentioned formation processes of a conductor circuit on the surface of said substrate 1 and in at least one of through holes of said substrate, a formation process of a conductor circuit 9 which comprises forming an adhesive layer 6 on the surface of the substrate, roughening its surface, forming a panel plated conductor 7 thereon by electroless copper plating and etching it by a tenting process using a dry film photoresist 8. This process is particularly advantageous as a formation process of a conductor circuit of a ceramic wiring board of this invention, because the sheet resistivity is low, the adhesion strength of the conductor circuit is high, and a fine pattern can be easily obtained. When a conductor circuit is applied by electroless plating, or electroless plating followed by electrolytic plating, it is desirable in order to improve the adhesion of an electroless plated conductor 7 and the substrate 1 that the surface of the ceramic substrate 1 is directly subjected to physical or chemical roughening, or alternatively an adhesive layer 6 is formed on the substrate and its surface is roughened. Particularly, according to the process of this invention, it is suitable to subject a substrate to a step of roughening the surface of an adhesive layer 6 coated a mixture of a heat-resistance resin with fine silica powder to the substrate 1 or further to the inside surfaces of the through holes 2A, and dissolving the fine silica powder with hydrofluoric acid after exposing the powder to the surface of the layer, because this step improves the adhesion strength of, especially, an electroless plated conductor. In order to improve the adhesion of an adhesive layer 6 to the substrate 1, it is also possible to subject the surface of the substrate to roughening or treatment with a coupling agent.

FIGS. 3(A) to (G) are illustrative diagrams of a production process of a ceramic wiring board fabricated by a step of making a ceramic substrate having a plurality of holes arranged regularly with a specified pitch, a step of filling at least one hole of said plurality of holes with an electrical insulating material, a step of boring one or more holes selected from said filled holes, and forming a conductor circuit on the surface of said substrate and in one or more holes of through holes of said substrate.

Figure 3A:
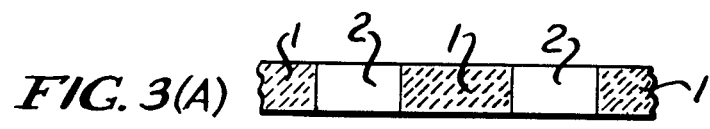

FIG. 3(A) is a sectional view of a ceramic substrate 1 having a plurality of holes 2 and 2, similar to those in FIG. 2(A), arranged regularly with a specified pitch.

Figure 3B:
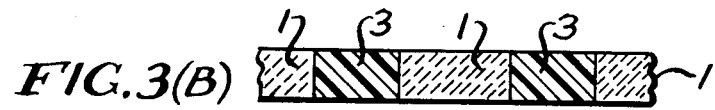

FIG. 3(B) is a sectional view of a ceramic substrate 1 formed by filling one or more holes of said plurality of holes 2 and 2 with an electrical insulating material 3 and, after solidification, smoothing the surface of the substrate 1 by grinding. When all of the holes are filled with an electrical insulating material, processes other than the above-mentioned, for example, direct filling by means of a squeegee without using a mask, or a roller-type hole filling apparatus can also be used. Holes which are not filled with the electrical insulating material can be used as, for example, holes for inserting guide pins for position alignment.

Figure 3C:
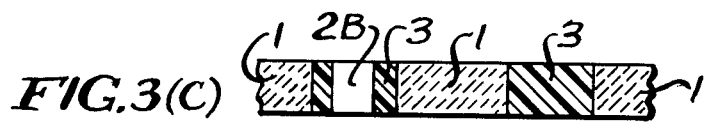
Figure 3D:
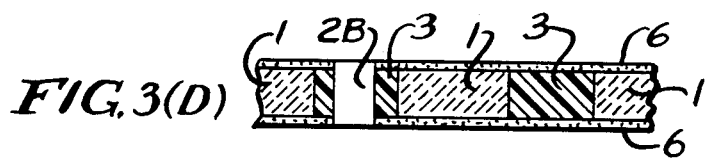
Figure 3E:
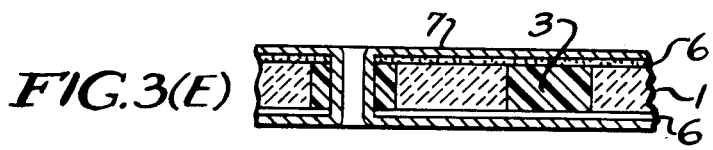
Figure 3F:
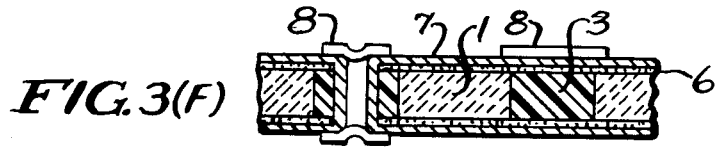
Figure 3G:
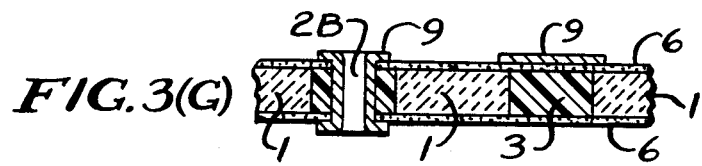

FIG. 3(C) is a sectional view of a ceramic substrate prepared by boring with a drill, for example, at least one hole 2B of holes selected from said filled holes, after curing of the filled electrical insulating material. Said holes 2B may be bored in any state when the electrical insulating material with which the holes are filled is in an uncured state, a semicured state, or a fully cured state. Processes for boring the holes include, for example, boring with drill, punching by means of a pin, opening by gas blow, and opening by exposure and development of a photosensitive heat-resistance resin used as an electrical insulating material, from which processes suitable one is selected according to the properties of the electrical insulating material with which the holes are filled. Especially when the holes are bored while the insulating material is in an uncured state, said holes 2B can be bored without leaving any electrical insulating material around each hole, and the surface of the substrate 1 can be smoothed by grinding, after boring, which is advantageous.

Japanese Patent Laid-Open No. 23796/1981 discloses an invention which relates to "a process for producing an IC substrate, characterized by drilling through holes passing from the top of a metal board to its back at arbitrary positions, filling these through holes with a synthetic resin filling material, coating an inorganic insulating substance on the external surface of the metal board, curing the substance, and thereafter boring electric wire passage holes passing the top of the metal board to its back." However, the present invention is greatly different from this invention in respect that whereas the above invention is a process in which through holes are made at arbitrary positions for the purpose of imparting an electrical insulation property to through holes made in the metal board, the present invention is a process in which a wiring board is prepared by using a ceramic substrate on which a plurality of holes are formed regularly with a specified pitch for the purpose of forming through holes in an electrical insulating ceramic substrate easily and inexpensively by using a universal mold. Japanese Patent Laid-Open No. 90959/1975 discloses a process for producing a ceramic printed circuit board, characterized by forming holes of a diameter larger than the necessary hole diameter on a ceramic printed circuit board before the board is sintered, filling said holes with an easily machinable substance after sintering, and forming necessary holes in the filled substance. However, the present invention is quite different from the above invention in that whereas, in the above invention, larger holes are formed previously at positions at which, for example, holes for position alignment are desired to form; in the present invention, a plurality of holes are provided regularly with a specified pitch, and it is apparent that the effects of these inventions are quite different from each other because of the difference in the above respects.

FIGS. 3(D) to (G) are sectional views illustrating the steps of forming a conductor circuit, corresponding to those shown in FIGS. 2(E) to (H).

It is also possible that the ceramic substrate or the ceramic wiring board prepared in this way is subjected to treatments, for example, printing with an overcoating material, formation of a printed resistor or a plated resistor, or scribing with $CO_2$-gas laser or cutting with a diamond cutter. Further, the ceramic wiring board of the present invention can be formed into a multilayer wiring board by printing on the ceramic wiring board with a thick film paste or a resin paste and, for example, by using a heat-resistance resin layer and copper plated conductor circuit.

Figure 4A:
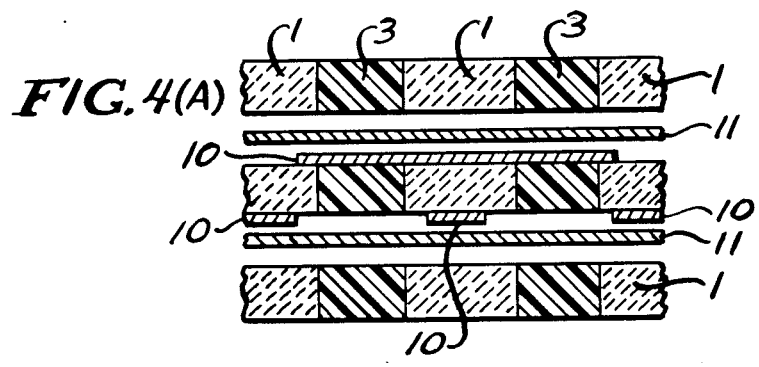
Figure 4B:
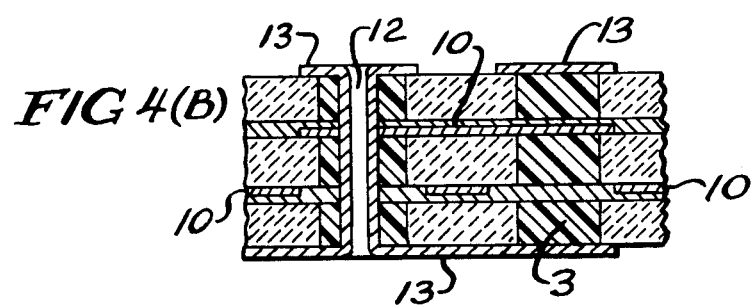

Further, as shown in FIGS. 4(A) and (B), the ceramic wiring board of the presen invention is extremely suitable for fabricating a multilayer ceramic wiring board by laminating with, for example, a heat-resistant adhesive material, its sheet, glass, and prepreg of glass-epoxy, after forming an innerlayer circuit 10, boring common through holes, and forming a conductor circuit 13, and is greatly advantageous in that a high-density multilayer ceramic wiring board can be prepared easily in high yields. It is also possible that a still higher-density multilayer ceramic wiring board is formed by providing blind through holes in the innerlayer circuit.

The present invention will now be, described with reference to examples.

EXAMPLE 1

A double-sided ceramic wiring board having through holes was produced by the following steps (1) to (7):

(1) Holes were made in a green sheet of mainly α-alumina fine powder by punching with a universal mold and the sheet was fired at 1600° C. to make a 96% alumina ceramic substrate (outside size of 82.2×82.2 mm, thickness of 0.635 mm) having holes of 0.4 mm dia arranged, as shown in FIG. 1 (A), on grid with a pitch of 2.54 mm.

(2) As shown in FIG. 2(B), the predetermined holes of the alumina ceramic substrate were filled with a pasty electrical insulating material by a screen printing method using a metal mask. Solid material was prepared by mixing 100 parts by weight (in terms of solids) of a heat-resistance epoxy resin solution (a product of Mitsui Petrochemical Ltd., TA-1850) with 500 parts by weight of a silane coupling agent-treated α-alumina fine powder of a particle diameter of 1~5 μm (a product of Sumitomo Aluminum Refinery Ltd.), and by dispersing in a disperser and kneading the mixture in a three-rolls mill.

(3) The electrical insulating material is semi-cured by heating it at 120° C. for 10 min in a hot-air dryer, excess electrical insulating material flowed over the holes of the ceramic substrate was ground by means of an automatic grinder to smooth the surface of the ceramic substrate, as shown in FIG. 2(C).

(4) An adhesive agent was prepared by mixing 100 parts by weight (in terms of solids) of a heat-resistance epoxy resin with 80 parts by weight of a silane coupling agent-treated fine silica powder of a particle diameter of 1~3 μm and kneading the mixture in a three-rolls mill. This adhesive agent was coated on the surface of the ceramic substrate surface-treated with a silane coupling agent by means of a roller coater, and heat-cured at 180° C. for 1 hr to form an adhesive layer of 10 μm thickness.

(5) In order to expose some of the fine silica powder on the surface of the adhesive layer, the surface of the adhesive layer was gently ground by means of a rotary brush grinder with a #1000 fine alumina abrasive, and the ceramic substrate was immersed into an aqueous hydrofluoric acid solution of a concentration of 25% for 2 min to roughen the surface of the adhesive layer.

(6) The entire surface of the ceramic substrate was activated by applying a palladium catalyst (a product of Shipley, Cataposit 44) thereto, and the substrate was immersed in a electroless copper plating solution used in an additive process having the following composition to apply a 7 μm-thick panel plated conductor thereto:
copper sulfate ($CuSO_4 \cdot 0.5H_2O$): 0.06 mol/l
formalin (37%): 0.3 mol/l
caustic soda (NaOH): 0.35 mol/l
EDTA: 0.12 mol/l
additive: a small amount
plating temperature of 70°~72° C.
pH of 12.4

(7) A conductor circuit was formed by a tenting process comprising the steps of grinding the copper-plated surface by scrubbing, laminating this surface with a dry film photoresist (a product of E. I. duPont, Riston 1015), exposing the photoresist through a glass mask, developing with 1,1,1-trichloroethane, etching the pattern with a cupric chloride etchant solution and removing the resist by treatment with methylene chloride.

The double-sided ceramic wiring board having through holes produced in this way showed good properties such as a high-density fine pattern of a minimum conductor width of 50 μm, a conductor resistance of 2.6 mΩ/□, and a conductor adhesion strength of 1.2~1.8 kgf/m$^2$, which were far better than those of a conventional thick-film conductor. With regard to interconnecting reliability of through holes, this wiring board had no trouble even after 200 cycles in a thermal shock test (MIL-STD-202E 107D Cond B), and showed high reliability.

(8) The carbon printed resistor having a size of 2×2 mm and a thickness of 15 μm was formed on the ceramic wiring board by printing a polymercarbon resistive paste (a product of Asahi Chemical Research Laboratory, TU-10K-5) and then by curing the paste at 170° C. for 1 hr, after electroless Ni/Al plating on the copper conductor circuit. When this resistor was stored in high humidity (40° C., 95% RH), it showed a rate of resistance change of +2.5% after 500 hr, while that of a carbon printed resistor formed on a heat-resistance glass-epoxy substrate by using the same conditions was +8.1%, which represented a large drift.

EXAMPLE 2

A double-sided ceramic wiring board having through holes was produced in the same manner as in Example 1, except that steps (1) to (3) in Example 1 were replaced by the following steps (1) to (3):

(1) Holes were made in the green sheet by punching with a universal mold and the green sheet was fired to make a 96% alumina ceramic substrate (outside size of 50.8×50.8 mm and thickness of 0.635 mm) having holes of 1.0 mm dia arranged on grid with a pitch of 2.54 mm as shown in FIG. 1(A).

(2) All of the holes of the ceramic substrate were filled with the same electrical insulating material as used in Example 1 by using a screen printer and the electrical insulating material was cured. Excess electrical insulating material flowed over the holes was ground to smooth the surface of the ceramic substrate as shown in 3(B).

(3) The predetermined holes among the holes filled with the electrical insulating material were bored by using a numerically controlled multi-spindle drilling machine (a product of Excellon Automation, Mark V Driller) with a 0.4 mm dia drill. The ceramic wiring board obtained in this way had excellent characteristics like the ceramic wiring board obtained in Example 1.

As described above, the ceramic wiring board of the present invention is freed from necessity of fabricating an individual mold for each substrate of a different wiring circuit, and can be formed by using a universal mold, and can be stocked in the form of a fired ceramic substrate. Therefore, the ceramic wiring board having through holes can be produced at low cost and within a very short lead time, and has a merit that the stock control of molds and fired ceramic substrates can be greatly improved. Further, since the ceramic wiring board of this invention has a plurality of holes arranged regularly with a specified pitch, the firing shrinkage of the substrate is brought into uniformity and a high dimensional accuracy can be obtained, so that it is suitable for attaining a high circuit density.

In addition, the ceramic wiring board of the present invention has advantages that the plated conductor having low sheet resistivity and excellent fine line capability can easily be applied, and the carbon printed resistor can be used stably because the dimensional stability of the substrate is good. Furthermore, formation of a multilayer circuit board is easy, so that a high-accuracy, high-density multilayer ceramic wiring board can also be produced.

From these advantages, the present ceramic wiring board having through holes is suitable for use in high-density wiring board for hybrid IC, wiring board for the surface mounting of IC chip and ceramic package, multilayer ceramic wiring boards for a computer, wiring boards for the development and trial production of a hybrid IC which lead time is very short, or IC packages such as pin-grid array type or chip carrier type, and therefore very useful industrially.

I claim:

1. A ceramic wiring board comprising a ceramic substrate having a plurality of holes arranged regularly with a given pitch, at least one hole selected from said plurality of holes being filled with at least one electrical insulating material selected from the group consisting of a heat resistance resin and a mixture thereof with a filler and being unclaimed, and a conductor circuit produced by a plating process being formed on the surface of said substrate and in at least one hole of through-holes of said substrate.

2. A wiring board according to claim 1, wherein the volume resistivity of said ceramic substrate is $10^8$ $\Omega$-cm or above.

3. A wiring board according to claim 1, wherein the material for said ceramic substrate is at least one member selected from the group consisting of alumina, beryllia, mullite, low-temperature fireable ceramic, aluminum nitride and silicon carbide.

4. A wiring board according to claim 1, wherein most of said plurality of holes are arranged on a grid.

* * * * *

UNITED STATES PATENT AND TRADEMARK OFFICE
CERTIFICATE OF CORRECTION

PATENT NO. : 4,792,646
DATED : December 20, 1988
INVENTOR(S) : Ryo ENOMOTO

It is certified that error appears in the above-identified patent and that said Letters Patent is hereby corrected as shown below:

Title page, item [75]

CHANGE "EYO" to --RYO--.

Signed and Sealed this

Second Day of May, 1989

Attest:

DONALD J. QUIGG

*Attesting Officer*        *Commissioner of Patents and Trademarks*